US012629780B2

(12) United States Patent
Sugimoto et al.

(10) Patent No.:  US 12,629,780 B2
(45) Date of Patent:      May 19, 2026

(54) LASER PROCESSING APPARATUS AND LASER PROCESSING METHOD

(71) Applicant: HAMAMATSU PHOTONICS K.K., Hamamatsu (JP)

(72) Inventors: Yo Sugimoto, Hamamatsu (JP); Takeshi Sakamoto, Hamamatsu (JP); Takafumi Ogiwara, Hamamatsu (JP); Naoki Uchiyama, Hamamatsu (JP); Takashi Kurita, Hamamatsu (JP); Ryo Yoshimura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 374 days.

(21) Appl. No.: 18/268,652

(22) PCT Filed: Dec. 20, 2021

(86) PCT No.: PCT/JP2021/047072
§ 371 (c)(1),
(2) Date: Jun. 21, 2023

(87) PCT Pub. No.: WO2022/138581
PCT Pub. Date: Jun. 30, 2022

(65) Prior Publication Data
US 2024/0082959 A1      Mar. 14, 2024

(30) Foreign Application Priority Data
Dec. 25, 2020      (JP) ................................. 2020-217220

(51) Int. Cl.
| | |
|---|---|
| *B23K 26/53* | (2014.01) |
| *B23K 26/03* | (2006.01) |
| *B23K 26/364* | (2014.01) |
| *H01L 21/268* | (2006.01) |
| *B23K 103/00* | (2006.01) |

(52) U.S. Cl.
CPC ............ *B23K 26/53* (2015.10); *B23K 26/032* (2013.01); *B23K 26/364* (2015.10); *H01L 21/268* (2013.01); *B23K 2103/56* (2018.08)

(58) Field of Classification Search
CPC .... B23K 26/53; B23K 26/032; B23K 26/364; B23K 2103/56; B23K 26/03;
(Continued)

(56) References Cited

U.S. PATENT DOCUMENTS

| | | | |
|---|---|---|---|
| 10,946,482 B2 * | 3/2021 | Kamiyama | ............. C30B 33/06 |
| 2009/0004780 A1 * | 1/2009 | Arita | ....................... H01L 21/78 |
| | | | 438/114 |

(Continued)

FOREIGN PATENT DOCUMENTS

| | | |
|---|---|---|
| CN | 106067432 A | 11/2016 |
| JP | 2007-173475 A | 7/2007 |

(Continued)

OTHER PUBLICATIONS

International Preliminary Report on Patentability mailed Jul. 6, 2023 for PCT/JP2021/047072.

*Primary Examiner* — Ibrahim A Khan
(74) *Attorney, Agent, or Firm* — Faegre Drinker Biddle & Reath LLP

(57) ABSTRACT

A laser processing apparatus includes a support unit that supports a wafer including a plurality of functional elements disposed adjacent to each other via a street, an irradiation unit that irradiates the street with laser light, and a control unit that controls the irradiation unit based on information about the streets so that a first region and a second region of the street are simultaneously irradiated with the laser light, and a power of the laser light for removing a surface layer of the street in the first region is higher than a power for removing the surface layer of the street in the first region. The information about the street includes information that a (Continued)

processing threshold value indicating a difficulty of laser processing in the first region is lower than a processing threshold value in the second region.

7 Claims, 19 Drawing Sheets

(58) Field of Classification Search
CPC ............ B23K 26/0676; B23K 2101/42; B23K 26/0626; B23K 26/067; B23K 2101/40; H01L 21/268; H01L 21/78
See application file for complete search history.

(56) References Cited

U.S. PATENT DOCUMENTS

| | | | | |
|---|---|---|---|---|
| 2009/0081830 | A1* | 3/2009 | Omandam | H01L 21/6836 |
| | | | | 257/E23.116 |
| 2014/0213043 | A1* | 7/2014 | Van Der Stam | B23K 26/359 |
| | | | | 219/121.68 |
| 2015/0049171 | A1* | 2/2015 | Ito | H01L 21/681 |
| | | | | 348/46 |
| 2016/0067819 | A1* | 3/2016 | Kuki | B23K 26/364 |
| | | | | 219/121.82 |
| 2017/0186656 | A1* | 6/2017 | Iwamoto | H01L 21/67282 |
| 2018/0200830 | A1* | 7/2018 | Yodo | B23K 26/57 |
| 2018/0226295 | A1* | 8/2018 | Sugiya | H01L 21/67115 |
| 2018/0247853 | A1* | 8/2018 | Furuta | B23K 26/009 |
| 2018/0294190 | A1* | 10/2018 | Ban | B23K 26/083 |
| 2018/0330972 | A1* | 11/2018 | Shigematsu | B23K 26/032 |
| 2020/0243388 | A1* | 7/2020 | Seddon | H01L 21/3065 |

FOREIGN PATENT DOCUMENTS

| | | | |
|---|---|---|---|
| JP | 2012-076090 A | 4/2012 |
| JP | 2014-223677 A | 12/2014 |
| JP | 2017-011040 A | 1/2017 |
| JP | 2017-174941 A | 9/2017 |

* cited by examiner (a)

(b)

LASER IRRADIATION POSITIONS
(FOCAL POINTS)

(c)

(a)

(b)
LASER IRRADIATION
POSITIONS (FOCAL POINTS)

(c)

(a)

(b)

23x

23(20)

23y

RELATIVE LASER
INTENSITY:0.3

RELATIVE LASER
INTENSITY:0.1

(a)

23y

23(20)

23x (b)

RELATIVE LASER
INTENSITY:0.1

RELATIVE LASER
INTENSITY:0.3

(c)

RELATIVE INTENSITY:0.3

RELATIVE INTENSITY:0.1

RELATIVE INTENSITY:0.3

(b)

(a)

57.6μm 57.6μm

RELATIVE INTENSITY:0.1

RELATIVE INTENSITY:0.3

RELATIVE INTENSITY:0.1

(c)

(b)

(a)

57.6μm 57.6μm (a)

PROCESSING MARK

MOVEMENT DIRECTION
OF WAFER WITH
RESPECT TO LASER (b)

SUBSTANTIALLY
OBTAINED INTERVAL
BETWEEN
PROCESSING POINTS

LASER PROCESSING APPARATUS AND LASER PROCESSING METHOD

TECHNICAL FIELD

One aspect of the present invention relates to a laser processing apparatus and a laser processing method.

BACKGROUND ART

In a wafer including a plurality of functional elements disposed adjacent to each other with a street therebetween, an insulating film (such as a Low-k film) and metal structures (such as metal piles and metal pads) may be formed on a surface layer of the street. In such a case, when a modified region is formed inside the wafer along a line passing through the street, and the wafer is divided into chips for each of the functional elements by extending a crack from the modified region, the quality of the chips may be degraded, for example, film peeling may occur at a place along the street. Therefore, when a wafer is divided into chips for each of the functional elements, grooving processing in which the surface layer of the street is removed by irradiating the street with laser light may be performed (refer to Patent Literature 1 and 2, for example).

CITATION LIST

Patent Literature

[Patent Literature 1] Japanese Unexamined Patent Publication No. 2007-173475
[Patent Literature 2] Japanese Unexamined Patent Publication No. 2017-011040

SUMMARY OF INVENTION

Technical Problem

Here, the structure of the surface layer of the street is usually not uniform, and includes a region in which laser processing is relatively difficult (a processing threshold is high) and a region in which the processing threshold is low. For example, when the street is irradiated with laser light under conditions in which a metal structure or the like can be reliably removed in the region in which the processing threshold is high, thermal damage may occur in the region in which the processing threshold is low. Such thermal damage causes deterioration in the quality of chips. On the other hand, when the street is irradiated with laser light under conditions in which thermal damage in the region in which the processing threshold is low can be reliably curbed, there is a risk that part of the metal structure in the region in which the processing threshold is high will remain. In this case, it is necessary to irradiate the region in which the processing threshold is high with laser light a plurality of times, which deteriorates processing throughput.

Thus, an object of one aspect of the present invention is to provide a laser processing apparatus and a laser processing method capable of efficiently processing a wafer while suppressing thermal damage to the wafer.

Solution to Problem

A laser processing apparatus according to an aspect of the present invention includes a support unit configured to support a wafer including a plurality of functional elements disposed adjacent to each other via a street, an irradiation unit configured to irradiate the street with laser light, and a control unit configured to control the irradiation unit based on information about the street so that a first region and a second region of the street are irradiated with the laser light at the same time, and a power of the laser light for removing a surface layer of the street in the second region is greater than a power for removing the surface layer thereof in the first region, wherein the information about the street includes information that a processing threshold value indicating a difficulty of laser processing in the first region is lower than a processing threshold value in the second region.

In the laser processing apparatus according to the aspect of the present invention, in grouping processing that removes the surface layer of the street, the irradiation unit is controlled so that radiation of the laser light to the first region and the second region is performed simultaneously and the power for removing the surface layer in the second region with a high processing threshold value is greater than the power for removing the surface layer in the first region with a low processing threshold value. As described above, in a case in which regions with different processing threshold values are present in the street, there is a possibility that thermal damage may occur in the region with the low processing threshold value, for example, when the laser light is radiated in accordance with the region with the high processing threshold value. On the other hand, for example, when the laser light is radiated in accordance with the region with the low processing threshold value, the surface layer of the region with the high processing threshold value is not sufficiently removed, it is thus necessary to radiate the laser light multiple times, and the throughput of processing deteriorates. In this regard, in the laser processing apparatus according to one aspect of the present invention, for the second region having a relatively high processing threshold value, the power for removing the surface layer of the street is made larger than that for the first region based on information about the processing threshold value of each of the regions, and the irradiation of the first region and the second region with the laser light is performed at the same time. In this way, laser irradiation with an intensity that does not cause thermal damage to the region with a low processing threshold value and laser irradiation with an intensity that does not require repeated processing for the region with a high processing threshold value are realized at the same time by irradiating each of the regions with laser light at the same time under conditions for each of the regions so that the power for removing the surface layer increases in the region with the higher processing threshold value according to the processing threshold value of each of the regions instead of radiating the laser light under conditions common to all regions according to one of the processing threshold values. As described above, according to the laser processing apparatus according to one aspect of the present invention, the wafer can be efficiently processed while thermal damage to the wafer is suppressed.

The control unit may make the power of the laser light for removing the surface layer in the second region greater than the power for removing the surface layer in the first region by arranging focal points of the laser light so that the number of focal points of the laser light per specific range in the second region is greater than the number of focal points of the laser light per specific range in the first region. According to such a configuration, it is possible to easily adjust the power for removing the surface layer of the laser light in each of the regions by simply arranging irradiation positions (focal points) without adjusting the intensity of the laser light itself.

The control unit may increase the power of the laser light for removing the surface layer in the second region more than the power for removing the surface layer in the first region by making an intensity of the laser light radiated to the second region greater than an intensity of the laser light radiated to the first region. According to such a configuration, it is possible to easily adjust the power with which the laser light removes the surface layer in each of the regions by simply adjusting the intensity of the laser light without complicating the arrangement of the focal points.

The control unit may control at least one of the support unit and the irradiation unit so that the laser light moves relatively along the street in a first direction, and the control unit may arrange a plurality of focal points of the laser light at positions different from each other in a second direction, which is a width direction of the street intersecting the first direction, and not overlapping each other in the first direction. Although it is desirable to arrange the plurality of focal points densely to some extent, when the plurality of focal points of the laser light are disposed linearly in the width direction (the second direction) of the street, the intensity distribution of the laser light in the second direction becomes non-uniform due to a light interference effect. In this regard, the influence of the light interference effect described above is reduced by arranging the plurality of focal points at positions that do not overlap each other in the first direction (that is, not disposed linearly in the second direction), and in this case it is possible to obtain a processing result equivalent to that of laser light having a uniform irradiation profile in the second direction.

The laser processing apparatus may further include an imaging unit configured to acquire image data of the street, and the control unit may identify the first region and the second region based on the image data. In this way, each of the regions of the street can be appropriately identified by identifying the first region and the second region in the street of the wafer based on the imagined image data, and laser light irradiation can be appropriately performed according to the region.

A laser processing method according to an aspect of the present invention includes a first step of preparing a wafer including a plurality of functional elements disposed adjacent to each other via a street, and a second step of, after the first step, irradiating the first region and the second region of the street with laser light at the same time based on information about the street so that a power for removing a surface layer of the street in the second region is greater than a power for removing the surface layer thereof in the first region, wherein the information about the street includes information that a processing threshold value indicating a difficulty of laser processing in the first region is lower than a processing threshold value in the second region. According to such a laser processing method, as in the laser processing apparatus described above, the wafer can be efficiently processed while thermal damage to the wafer is suppressed.

The laser processing method may further include a third step of acquiring image data of the street and identifying the first region and the second region based on the image data, after the first step and before the second step. According to such a laser processing method, each of the regions of the street can be appropriately identified, and laser light irradiation corresponding to the region can be appropriately performed.

The laser processing method may further include, after the first step, a fourth step of forming a modified region inside the wafer along a line passing through the street. According to such a laser processing method, the wafer can be divided into chips for each of the functional elements by allowing cracks extending from the modified region to reach the street along the line.

Advantageous Effects of Invention

According to one aspect of the present invention, it is possible to efficiently process a wafer while thermal damage to the wafer is suppressed.

DESCRIPTION OF EMBODIMENTS

Figure 1:
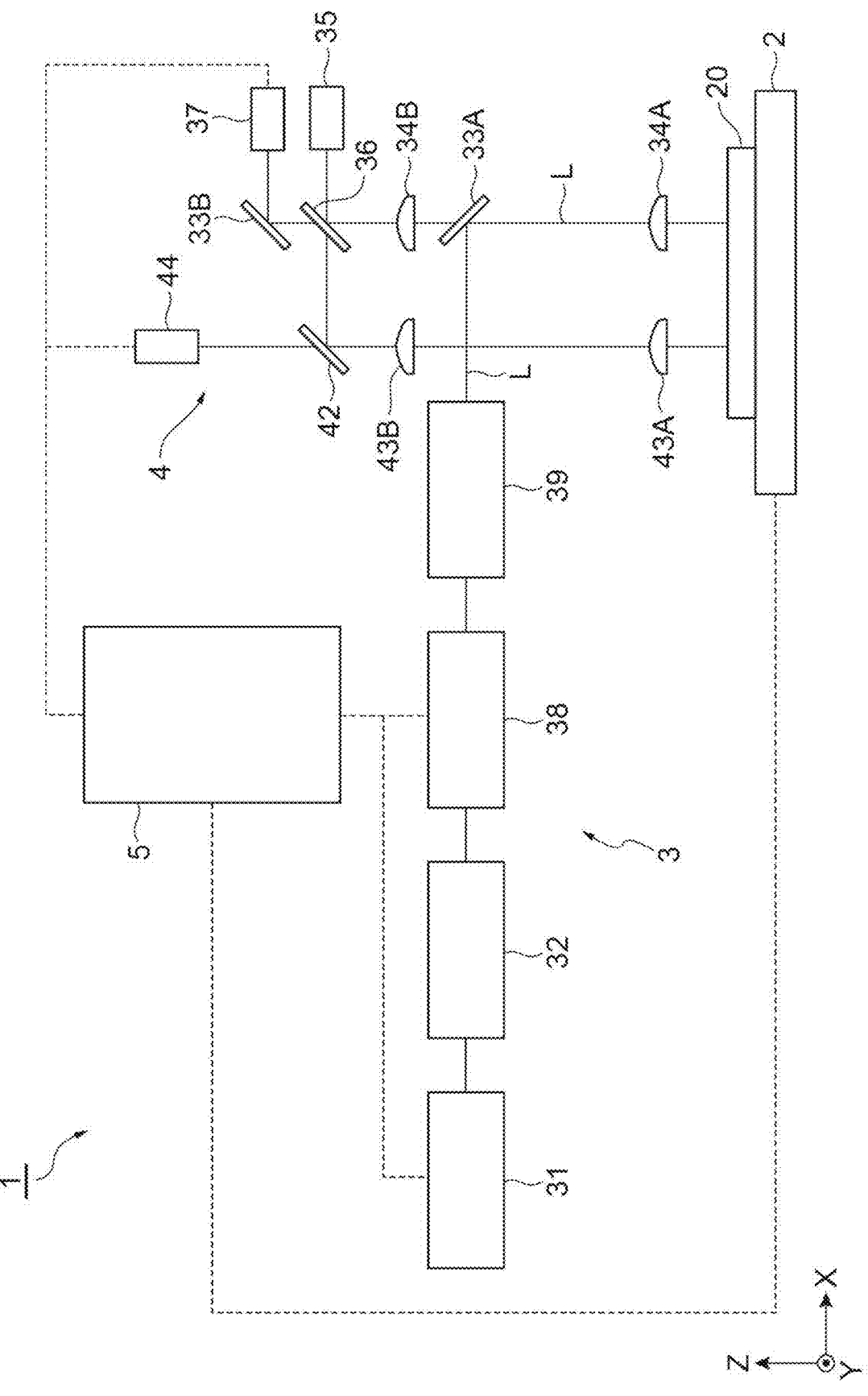
FIG. 1 is a configuration diagram of a laser processing apparatus according to one embodiment.

Hereinafter, embodiments for implementing the present invention will be described in detail with reference to the drawings. In each of the drawings, the same or corresponding parts are denoted by the same reference numerals, and redundant explanations will be omitted.

[Configuration of Laser Processing Apparatus]

As shown in FIG. 1, a laser processing apparatus 1 includes a support unit 2, an irradiation unit 3, an imaging unit 4, and a control unit 5. The laser processing apparatus 1 is an apparatus that performs grooving processing for removing a surface layer of a street of a wafer 20 by irradiating the street (details of which will be described below) of the wafer 20 with laser light L. In the following description, three mutually orthogonal directions are referred to as an X direction, a Y direction and a Z direction, respectively. As an example, the X direction is a first horizontal direction, the Y direction is a second horizontal direction perpendicular to the first horizontal direction, and the Z direction is a vertical direction.

The support unit 2 supports the wafer 20. The support unit 2 holds the wafer 20 so that a surface of the wafer 20 including the street faces the irradiation unit 3 and the imaging unit 4 by, for example, suctioning a film (not shown) attached to the wafer 20. As an example, the support unit 2 can move along each of the X direction and the Y direction and can rotate about an axis parallel to the Z direction.

The irradiation unit 3 irradiates the street of the wafer 20 supported by the support unit 2 with the laser light L. The irradiation unit 3 includes a light source 31, a shaping optical system 32, a spatial light modulator 38, an imaging optical system 39, a mirror 33A, a light collecting unit 34A, a light source 35, a beam splitter 36, a lens 34B, a mirror 33B, and an imaging device 37.

The light source 31 emits the laser light L. The shaping optical system 32 adjusts the laser light L emitted from the light source 31. As an example, the shaping optical system 32 includes at least one of an attenuator that adjusts an output of the laser light L and a beam expander that expands a diameter of the laser light L. The spatial light modulator 38 modulates a phase of the laser light L. The spatial light modulator 38 modulates the laser light L according to a modulation pattern displayed on a liquid crystal layer. The modulation pattern is a hologram pattern that imparts modulation. The spatial light modulator 38 is, for example, a liquid crystal on silicon (LCOS) spatial light modulator (SLM). The imaging optical system 39 forms an image of the laser light L modulated by the spatial light modulator 38. The imaging optical system 39 constitutes, for example, a double-telecentric optical system in which a modulation surface of the spatial light modulator 38 and an entrance pupil surface of the light collecting unit 34A are in an imaging relationship. The mirror 33A reflects the laser light L that has passed through the imaging optical system 39 and causes it to be incident on the light collecting unit 34A. The light collecting unit 34A converges the laser light L reflected by the mirror 33A onto the street of the wafer 20 supported by the support unit 2.

The light source 35 emits visible light. The beam splitter 36 reflects some of the visible light emitted from the light source 35 to be incident on the lens 34B and transmits the rest. The visible light incident on the lens 34B passes through the lens 34B, the mirror 33A, and the light collecting unit 34A and is irradiated onto the street of the wafer supported by the support unit 2. The imaging device 37 detects the visible light reflected by the street of the wafer 20, transmitted through the light collecting unit 34A, the mirror 33A, the lens 34B, and the beam splitter 36, and reflected by the mirror 33B. In the laser processing apparatus 1, the control unit 5 moves the light collecting unit 34A in the Z direction based on detection results of the imaging device 37 so that a focal point of the laser light L is located on the street of the wafer 20, for example.

The imaging unit 4 acquires image data of the street of the wafer supported by the support unit 2. The imaging unit 4 includes a beam splitter 42, a lens 43B, a light collecting unit 43A, and an imaging device 44. The beam splitter 42 reflects the visible light emitted from the light source 35 and transmitted through the beam splitter 36 to be incident on the lens 43B. The visible light incident on the lens 43B is transmitted through the lens 43B and the light collecting unit 43A and is irradiated onto the street of the wafer 20 supported by the support unit 2. The imaging device 44 detects the visible light that has been reflected by the street of the wafer 20 and transmitted through the light collecting unit 43A, the lens 43B, and the beam splitter 42.

The control unit 5 controls the operation of each of the units of the laser processing apparatus 1. The control unit 5 includes a processing unit 51, a storage unit 52 and an input reception unit 53. The processing unit 51 is a computer device including a processor, a memory, a storage, a communication device, and the like. In the processing unit 51, the processor executes software (a program) read into the memory or the like, and controls reading and writing of data in the memory and the storage, and communication by the communication device. The storage unit 52 is, for example, a hard disk or the like, and stores a variety of data. The input reception unit 53 is an interface unit that receives an input of a variety of data from an operator. As an example, the input reception unit 53 is at least one of a keyboard, a mouse, and a graphical user interface (GUI).

[Configuration of Wafer]

Figure 2:
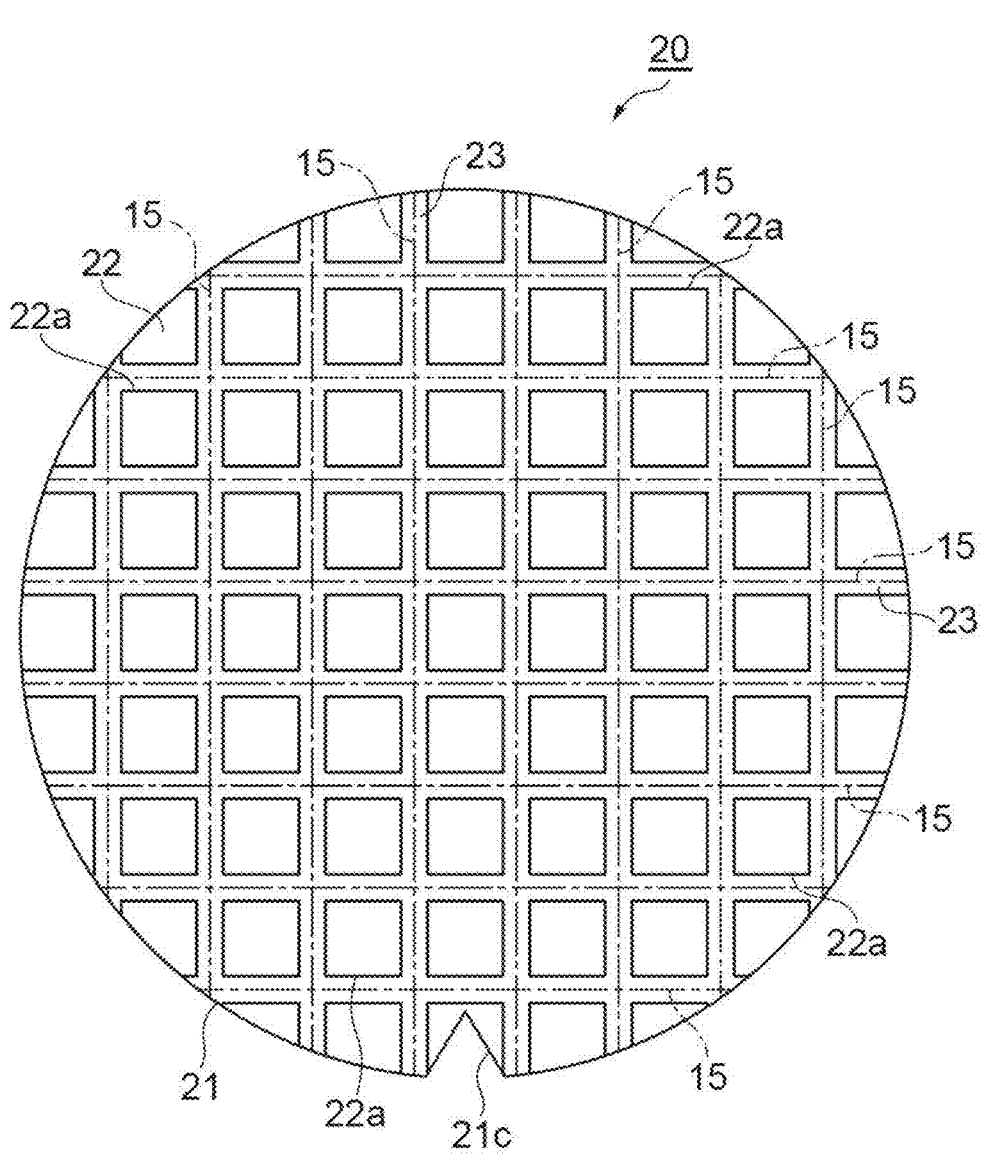
FIG. 2 is a plan view of a wafer processed by the laser processing apparatus shown in FIG. 1.
Figure 3:
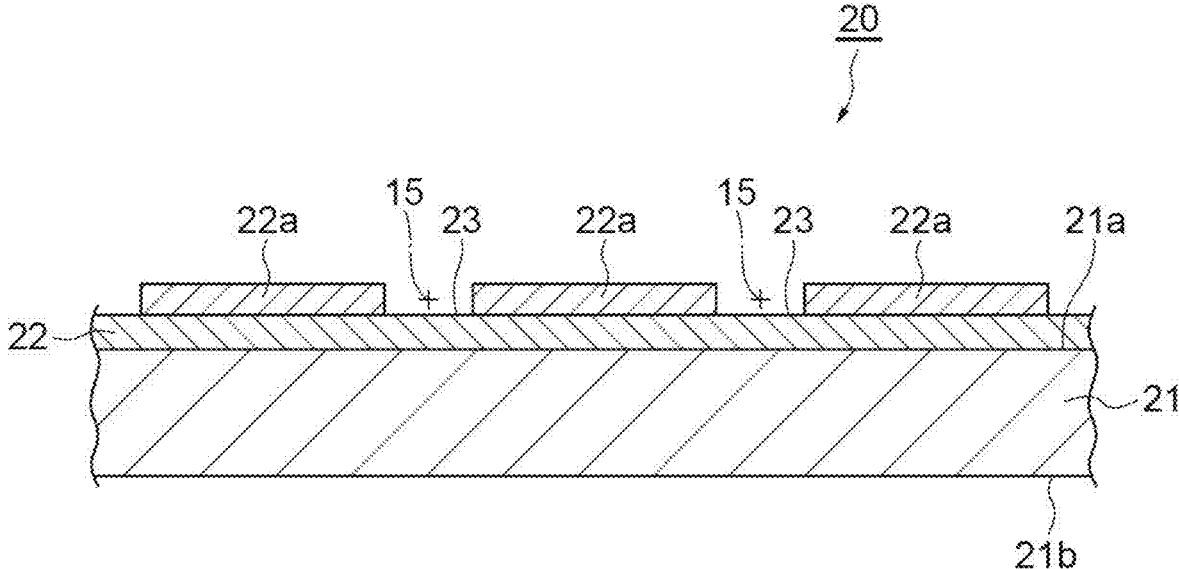
FIG. 3 is a cross-sectional view of a part of the wafer shown in FIG. 2.

As shown in FIGS. 2 and 3, the wafer 20 includes a semiconductor substrate 21 and functional elements 22. The semiconductor substrate 21 has a front surface 21a and a back surface 21b. The semiconductor substrate 21 is, for example, a silicon substrate. A notch 21c indicating a crystal orientation is provided in the semiconductor substrate 21. An orientation flat may be provided on the semiconductor substrate 21 instead of the notch 21c. The functional element 22 is formed on the front surface 21a of the semiconductor substrate 21. The functional element 22 includes a plurality of functional elements 22a. The plurality of functional elements 22a are disposed two-dimensionally along the front surface 21a of the semiconductor substrate 21. Each of the functional elements 22a is, for example, a light receiving element such as a photodiode, a light emitting element such as a laser diode, a circuit element such as a memory, or the like. Each of the functional elements 22a may be configured three-dimensionally by stacking a plurality of layers.

Figure 4:
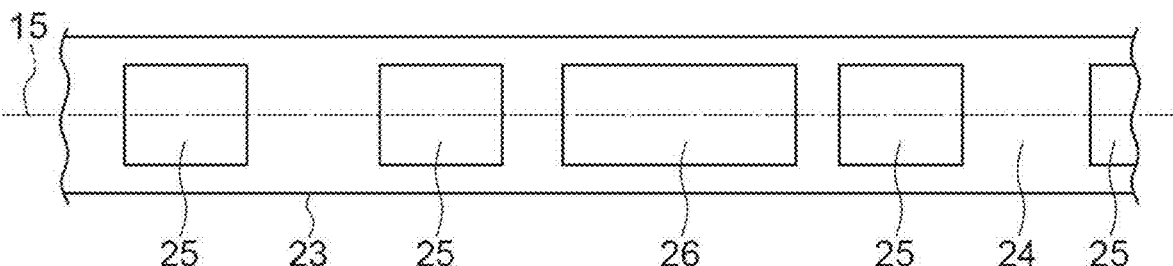
FIG. 4 is a plan view of a part of a street shown in FIG. 2.

A plurality of streets 23 are formed on the wafer 20. The plurality of streets 23 are regions exposed to the outside between the functional elements 22a adjacent to each other. That is, the plurality of functional elements 22a are disposed adjacent to each other with the streets 23 interposed therebetween. As an example, the plurality of streets 23 extend in a grid pattern so as to pass between the adjacent functional elements 22a with respect to the plurality of functional elements 22a disposed in a matrix. As shown in FIG. 4, an insulating film 24 and a plurality of metal structures 25 and 26 are formed on a surface layer of each of the streets 23. The insulating film 24 is, for example, a Low-k film. Each of the metal structures 25 and 26 is, for example, a metal pad. The metal structures 25 and 26 are different from each other, for example, in at least one of a thickness, an area, and a material.

As shown in FIGS. 2 and 3, the wafer 20 is scheduled to be cut into the functional elements 22a along each of a plurality of lines 15 (that is, to be divided into chips for the functional elements 22a). Each of the lines 15 passes through each of the streets 23 when seen in a thickness direction of the wafer 20. As an example, each of the lines 15 extends to pass through a center of each of the streets 23 when seen in the thickness direction of the wafer 20. Each of the lines 15 is a virtual line set on the wafer 20 by the laser processing apparatus 1. Each of the lines may be a line actually drawn on wafer 20.

[Operation of Laser Processing Apparatus and Laser Processing Method]

The laser processing apparatus 1 irradiates each of the streets 23 with the laser light L to perform grooving processing for removing the surface layer of each of the streets 23. Specifically, the control unit 5 controls the irradiation unit 3 so that each of the streets 23 of the wafer supported by the support unit 2 is irradiated with the laser light L, and the control unit 5 controls the support unit 2 so that the laser light L moves relatively along each of the streets 23. At this time, the control unit 5 controls the irradiation unit 3 based on information about the streets 23 so that a power for removing the surface layer of the street 23 in a second region of the street 23 is greater than a power for removing the surface layer of the street 23 in a first region of the street 23, and the first region and the second region are irradiated with the laser light L at the same time. Here, the "information about the street 23" is "information that a processing threshold value indicating a difficulty of laser processing in the first region is lower than a processing threshold value in the second region." Such a difference in the processing threshold value is due to a fact that the structure of the surface layer of the street 23 is not uniform. That is, each of the streets 23 includes a region (the first region) in which the laser processing is relatively easy and a region (the second region) in which the laser processing is relatively difficult.

As described above, it is possible to simultaneously achieve laser irradiation with an intensity that does not cause thermal damage to a region in which the processing threshold value is low and laser irradiation with an intensity that does not require repeated processing for a region in which the processing threshold value is high by simultaneously irradiating each of the regions with the laser light L under conditions for each of the regions so that the power for removing the surface layer increases in the region in which the processing threshold value is higher according to the processing threshold value of each of the regions instead of irradiating the street 23 with the laser light L under conditions common to all regions. Thus, the wafer 20 can be efficiently processed while the thermal damage to the wafer 20 is suppressed.

A laser processing method using the laser processing apparatus 1 will be described with reference to a flowchart of FIG. 5. As a premise for performing the processing described below, it is assumed that a processing threshold value indicating the difficulty of processing is identified for each of the regions in the street 23. Specifically, it is assumed that, as the information about the street 23, it is identified that the processing threshold value in the first region is lower than the processing threshold value in the second region. Such information about the street 23 may be identified by, for example, preparing a test wafer in advance, radiating laser light on the wafer to form a modified region, and identifying a crack state that extends from the modified region. The information about the street 23 is stored in the storage unit 52 of the control unit 5 in the laser processing apparatus 1.

Figure 5:
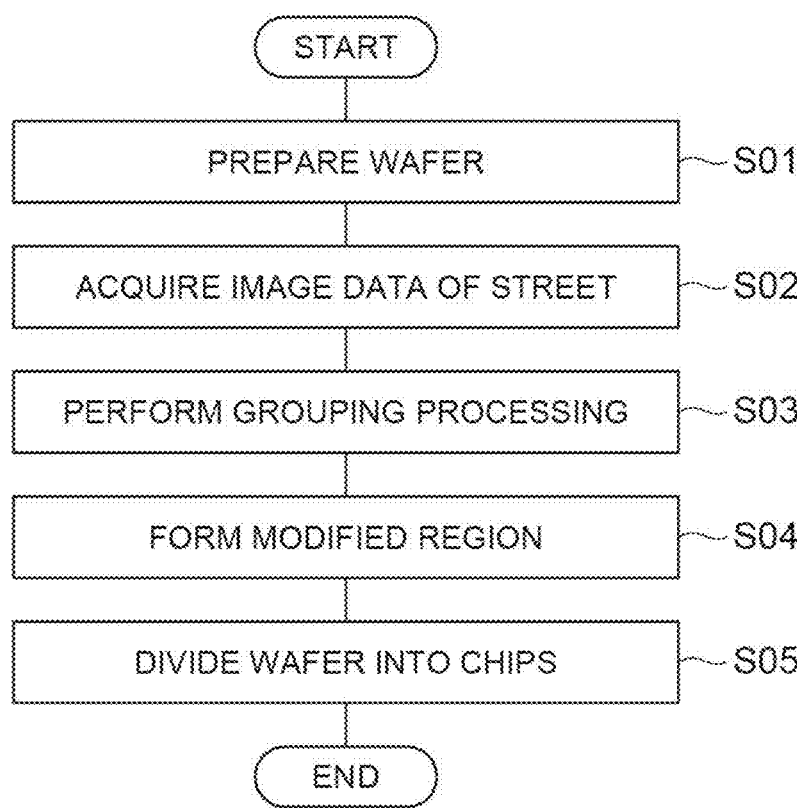
FIG. 5 is a flowchart of a laser processing method according to one embodiment.

As shown in FIG. 5, first, the wafer 20 is prepared (S01 shown in FIG. 5) (a first step). Subsequently, in the laser processing apparatus 1, image data of each of the streets 23 of the wafer 20 is acquired by the imaging unit 4 while the wafer 20 is supported by the support unit 2 (S02 shown in FIG. 5). The image data is stored by the storage unit 52 of the control unit 5 in the laser processing apparatus 1.

Subsequently, the grooving processing is performed on the wafer 20 in the laser processing apparatus 1 (S03 shown in FIG. 5) (a second step).

Specifically, the control unit 5 controls the irradiation unit 3 so that each of the streets 23 of the wafer 20 supported by the support unit 2 is irradiated with the laser light L, and the control unit 5 controls the support unit 2 so that the laser light L moves relatively along each of the streets 23. At this time, the control unit 5 controls the irradiation unit 3 based on the image data of each of the streets 23 acquired from the imaging unit 4 and the information about the street 23 acquired in advance so that the power for removing the surface layer of the street 23 in the second region of the street 23 is greater than the power for removing the surface layer of the street 23 in the first region of the street 23, and also the first region and the second region are irradiated with the laser light L at the same time (details will be described later).

In the laser processing apparatus 1, the control unit 5 controls the irradiation unit 3 based on the image data of each of the streets 23 acquired from the imaging unit 4 so that position information of the first region and the second region in each of the streets 23 is identified in advance (a third step) (the position information is stored by the storage unit 52 of the control unit 5 of the laser processing apparatus 1), the power for removing the surface layer of the streets 23 in the second region is greater than the power for removing the surface layer of the streets 23 in the first region, and also the first region and the second region are irradiated with the laser light L at the same time.

Figure 6:
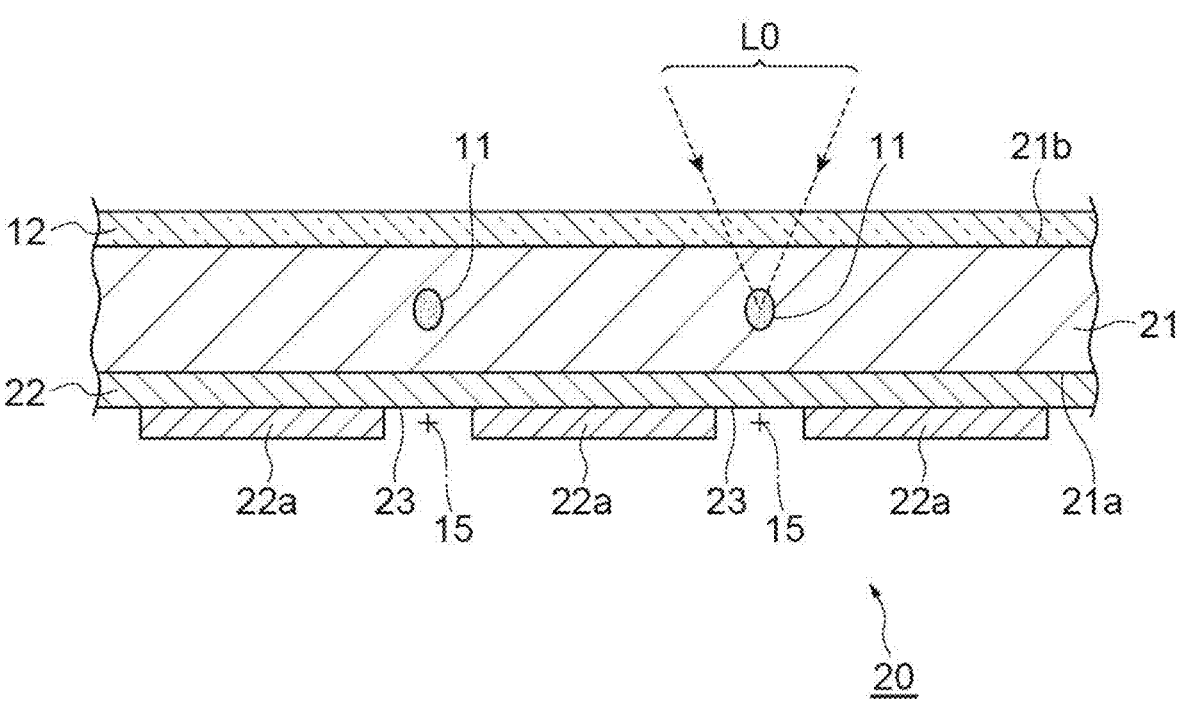
FIG. 6 is a cross-sectional view of a part of a wafer for describing the laser processing method of one embodiment.

Subsequently, as shown in FIG. 6, in a laser processing apparatus (not shown), the modified region 11 is formed inside the wafer 20 along each of the lines 15 by irradiating the wafer 20 with laser light LO along each of the lines 15 (S04 shown in FIG. 5) (a fourth step). The modified region 11 is a region that differs in density, refractive index, mechanical strength, and other physical properties from surrounding unmodified regions. The modified region 11 includes, for example, a melting processing region, a crack region, a dielectric breakdown region, a refractive index change region, and the like. The modified region 11 has a characteristic that cracks tend to extend from the modified region 11 to the incident side of the laser light LO and the opposite side thereto.

Figure 7:
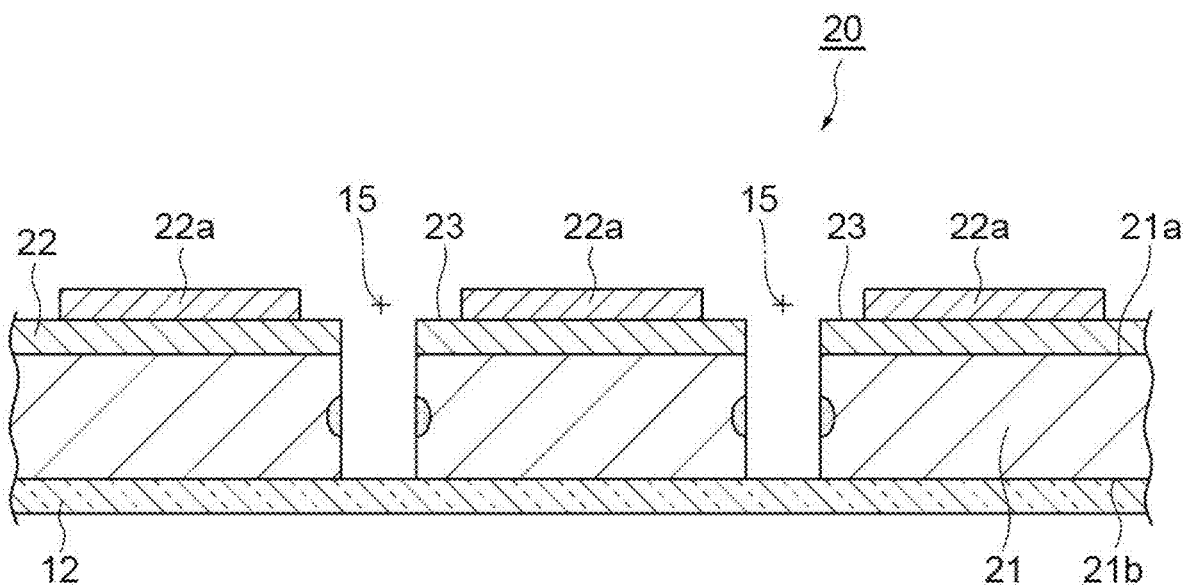
FIG. 7 is a cross-sectional view of a part of the wafer for describing the laser processing method of one embodiment.

Subsequently, as shown in FIG. 7, in an expanding device (not shown), as an expanding film 12 is expanded, cracks extend in the thickness direction of the wafer 20 from the modified region 11 formed inside the semiconductor substrate 21 along each of the lines 15, and a wafer 20 for mass production is divided into chips for each of the functional elements 22a (S05 shown in FIG. 5).

Next, processing of the control unit 5 will be described in more detail. The control unit 5 controls the irradiation unit 3 based on information about the streets 23 (information that the processing threshold value in the first region is lower than the processing threshold value in the second region), so that the first region and the second region of the street 23 are irradiated with laser light at the same time, and the power of the laser light for removing the surface layer of the street 23 in the second region is greater than the power thereof for removing the surface layer of the streets 23 in the first region.

The control unit 5 increases the power of the laser light for removing the surface layer of the street 23 in the second region more than the power thereof for removing the surface layer of the street 23 in the first region by, for example, arranging focal points of the laser light so that the number of focal points of the laser light per specific range in the second region is greater than the number of focal points of the laser light per specific range in the first region. The control unit 5 controls the arrangement of the focal points of the laser light by, for example, adjusting a modulation pattern (a hologram pattern) displayed on the liquid crystal layer of the spatial light modulator 38.

Figure 8:
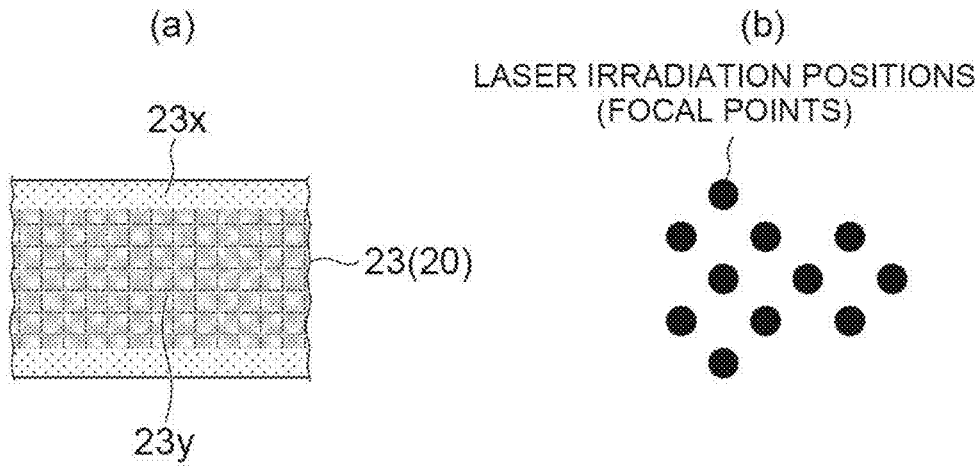
FIG. 8 is a diagram for describing an aspect of laser irradiation.
Figure 8:
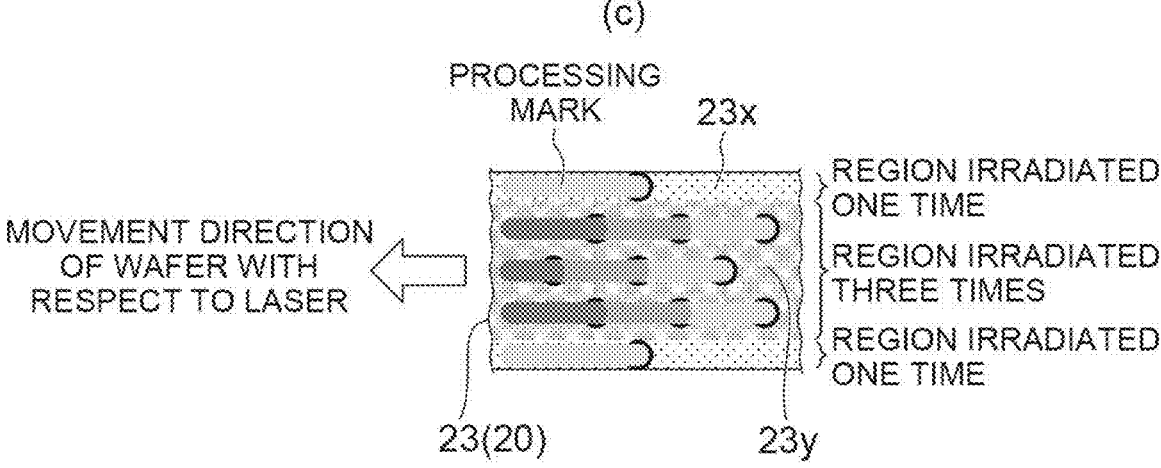
Figure 9:
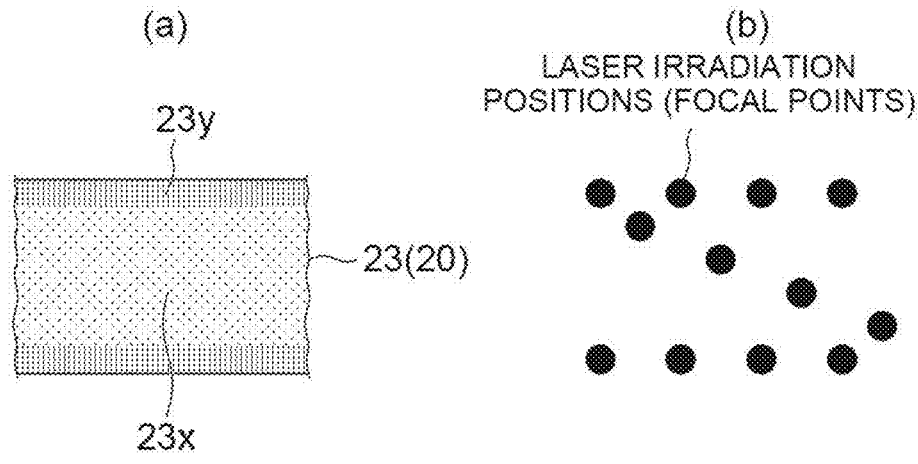
FIG. 9 is a diagram for describing the aspect of the laser irradiation.
Figure 9:
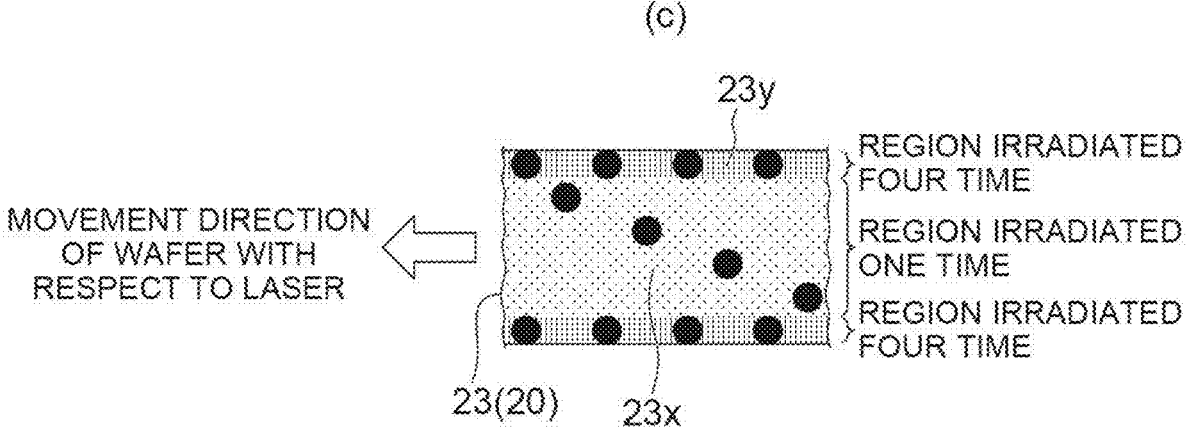

FIGS. 8 and 9 are diagrams for describing a mode of laser irradiation in the case in which the arrangement of the focal points of the laser light described above is controlled. In FIGS. 8 and 9, (a) is a diagram showing a first region 23x and a second region 23y in the street 23 of the wafer 20, (b) is a diagram showing irradiation positions (the focal points) of the laser light, and (c) is a diagram showing the number of times of irradiation (the number of focal points) for each of the regions. An "extension direction" (a first direction) of the street 23 described below is a left-right direction in FIG. 8 and the like, and a "width direction" (a second direction) of the street 23 is a vertical direction in FIG. 8 and the like.

In the example shown in FIG. 8, as shown in FIG. 8(a), the first region 23x made of a material with a low processing threshold value is formed on both end portions of the street 23 in the width direction, and the second region 23y made of a material with a high processing threshold value is formed in a central portion of the street 23 in the width direction. The "low processing threshold value" of the first region 23x indicates that the processing threshold value is lower than that of the second region 23y, and the "high processing threshold value" of the second region 23y indicates that the processing threshold value is higher than that of the first region 23x. Such a street 23 is irradiated with the laser light at the irradiation position (the focal point) as shown in FIG. 8(b), for example. In the example shown in FIG. 8(b), there is only one irradiation position (the focal point) in the extension direction of the street 23 at both end portions of the street 23 in the width direction corresponding to the first region 23x. In addition, in the central portion of the street 23 in the width direction corresponding to the second region 23y, there are three irradiation positions (focal points) in the extension direction of the street 23 per specific range. The specific range here is a predetermined range in the width direction, and in the example shown in FIG. 8, it is a range in the width direction of the first region 23x. That is, in the example shown in FIG. 8, in the second region 23y, when seen from a range (a size) in the width direction of the first region 23x, each of the ranges has three irradiation positions (the focal points) in the extension direction of the street 23. As shown in FIG. 8(c), when the laser light is radiated at the focal point shown in FIG. 8(b) and the wafer 20 is moved in the extension direction of the street 23 with respect to the laser light, laser light irradiation is repeatedly performed such that, in the extension direction of the street 23, for the first region 23x, the number of focal points of the laser light per specific range is one (one irradiation), and for the second region 23y, the number of focal points of the laser light per specific range is three (three irradiations).

In the example shown in FIG. 9, as shown in FIG. 9(a), the second region 23y made of a material with a high processing threshold value is formed on both end portions of the street 23 in the width direction, and the first region 23x made of a material with a low processing threshold is formed in the center portion of the street 23 in the width direction. Such a street 23 is irradiated with the laser light at irradiation positions (focal points) as shown in FIG. 9(b), for example. In the example shown in FIG. 9(b), there are four irradiation positions (focal points) in the extension direction of the street 23 at both end portions of the street 23 in the width direction corresponding to the second region 23y. Also, in the central portion of the street 23 in the width direction corresponding to the first region 23x, there is only one irradiation position (focal point) in the extension direction of the street 23 per specific range. The specific range here is a predetermined range in the width direction, and in the example shown in FIG. 9, it is a range in the width direction of the second region 23y. That is, in the example shown in FIG. 9, in the first region 23x, when seen at a range (a size) in the width direction of the second region 23y, each range has only one irradiation position (focal point) in the extension direction of the street 23. As shown in FIG. 9(c), when the laser light is radiated at the focal points shown in FIG. 9(b) and the wafer 20 is moved in the extension direction of the street 23 with respect to the laser light, the laser light irradiation is repeatedly performed such that, in the extension direction of the street 23, for the first region 23x, the number of laser light focal points per specific range is one (one irradiation), and for the second region 23y, the number of focal points of the laser light per specific range is four (four irradiations).

Figure 10:
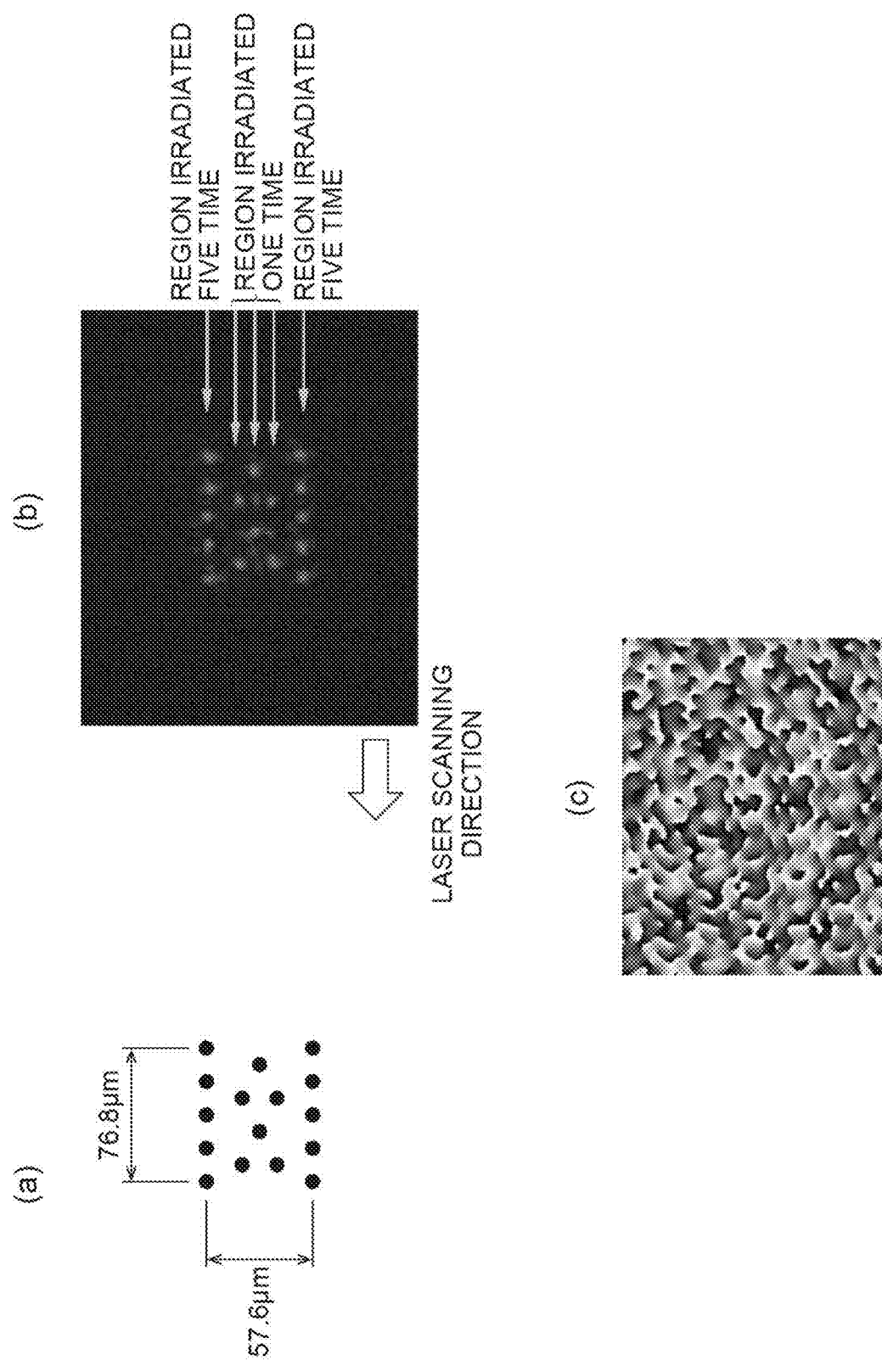
FIG. 10 is a diagram for describing the aspect of the laser irradiation.
Figure 11:
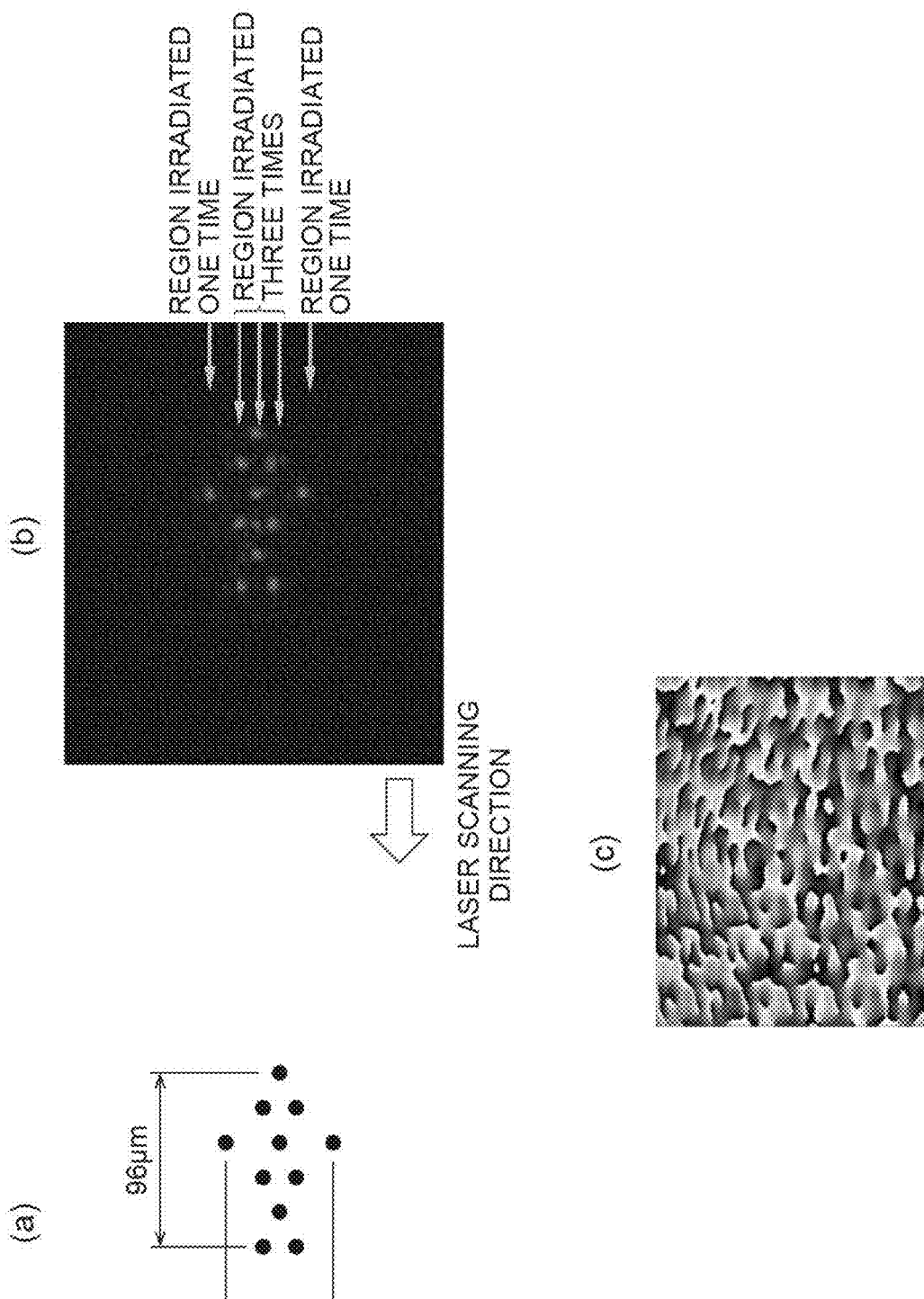
FIG. 11 is a diagram for describing the aspect of the laser irradiation.

FIGS. 10 and 11 are diagrams for describing an irradiation position design example when the arrangement of the focal points of laser light is controlled. In FIGS. 10 and 11, (a) is a design example of a laser irradiation arrangement, (b) is a pattern of laser focusing positions, and (c) is a modulation pattern (a hologram pattern) displayed on the spatial light modulator 38. FIG. 10 shows an example in which both end portions of the street 23 in the width direction are the second regions 23y, the number of focal points per specific range is five, the central portion in the width direction of the street 23 is the first region 23x, and the number of focal points per specific range is two. FIG. 11 shows an example in which both end portions of the street 23 in the width direction are the first regions 23x, the number of focal points per specific range is one, the central portion of the street 23 in the width direction is the second region 23y, and the number of focal points per specific range is three.

In the example shown in FIG. 10, for example, a laser irradiation arrangement is as shown in FIG. 10(a). As shown in FIG. 10(a), for example, a distance between both end portions of the focal points in the first direction is 76.8 μm, and a distance between both end portions of the focal points in the second direction is 57.6 μm. Then, a hologram pattern shown in FIG. 10(c) is generated as a hologram pattern that realizes a pattern of the laser focal positions shown in FIG. 10(b). In the example shown in FIG. 11, for example, a laser irradiation arrangement is as shown in FIG. 11(a). As shown in FIG. 11(a), for example, the distance between both end portions of the focal points in the first direction is 96 μm, and a distance between both end portions of the focal points in the second direction is 57.6 μm. Then, the hologram pattern shown in FIG. 11(c) is generated as a hologram pattern that realizes the pattern of the laser focal positions shown in FIG. 11(b).

Further, the control unit 5 may set the power of the laser light for removing the surface layer of the street 23 in the second region higher than the power for removing the surface layer of the street 23 in the first region by, for example, increasing the intensity of the laser light radiated to the second region more than the intensity of the laser light radiated to the first region. The control unit 5 controls the intensity of the laser light by, for example, adjusting the modulation pattern (the hologram pattern) displayed on the liquid crystal layer of the spatial light modulator 38.

Figure 12:
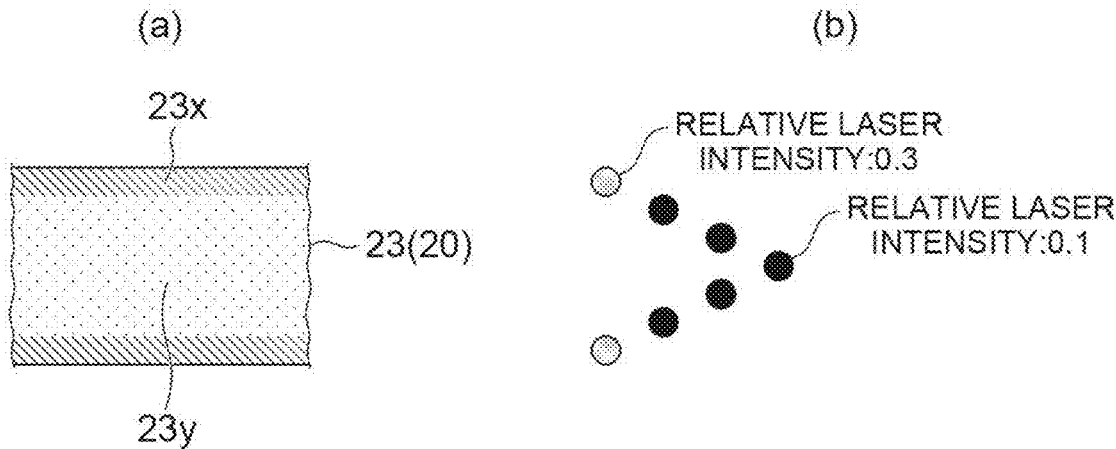
FIG. 12 is a diagram for describing the aspect of the laser irradiation.
Figure 13:
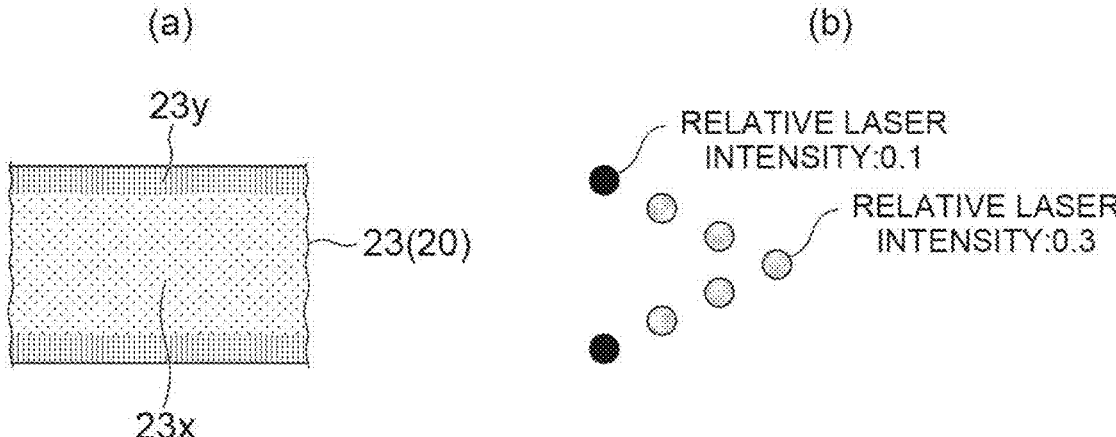
FIG. 13 is a diagram for describing the aspect of the laser irradiation.

FIGS. 12 and 13 are diagrams for describing the mode of the laser irradiation when the intensity of the laser light described above is controlled. In FIGS. 12 and 13, (a) is a diagram showing the first region 23x and the second region 23y in the street 23 of the wafer 20, and (b) is a diagram showing the irradiation intensity of the laser light.

In the example shown in FIG. 12, as shown in FIG. 12(*a*), the first region 23x made of a material with a low processing threshold value is formed on both end portions of the street 23 in the width direction, and the second region 23y made of a material with a high processing threshold value is formed in the central portion of the street 23 in the width direction. For such a street 23, for example, as shown in FIG. 12(*b*), when the intensity of the laser light radiated to the second region 23y is set to 1.0, the laser light is radiated so that the intensity of the laser light radiated to the first region 23x is 0.3.

In the example shown in FIG. 13, as shown in FIG. 13(*a*), the second region 23y made of a material with a high processing threshold value is formed on both end portions of the street 23 in the width direction, and the first region 23x made of a material with a low processing threshold value is formed in the center portion of the street 23 in the width direction. For such a street 23, for example, as shown in FIG. 13(*b*), when the intensity of the laser light radiated to the second region 23y is set to 1.0, the laser light is radiated so that the intensity of the laser light radiated to the first region 23x is 0.3.

Figure 14:
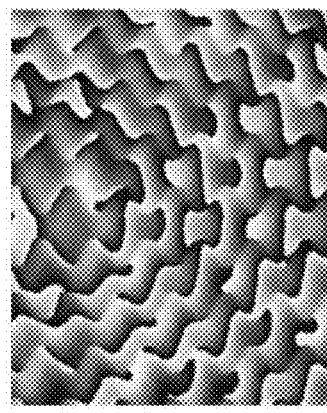
FIG. 14 is a diagram for describing the aspect of the laser irradiation.
Figure 14:
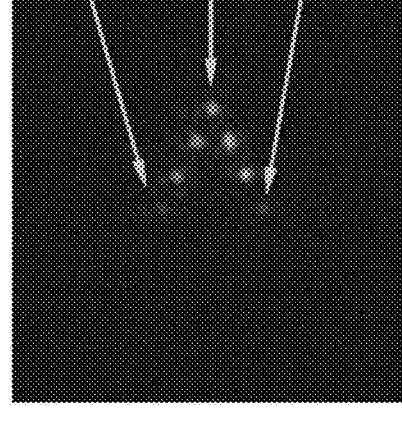
Figure 14:
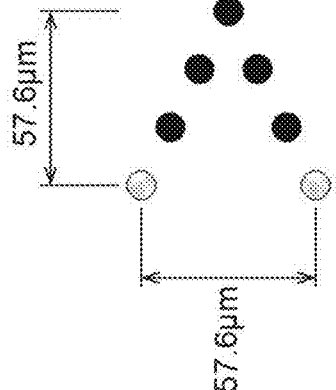
Figure 15:
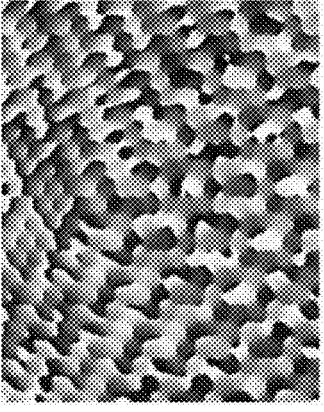
FIG. 15 is a diagram for describing the aspect of the laser irradiation.
Figure 15:
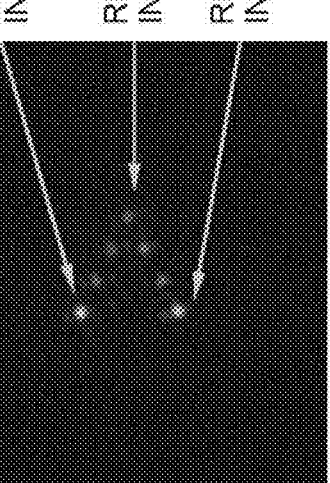
Figure 15:
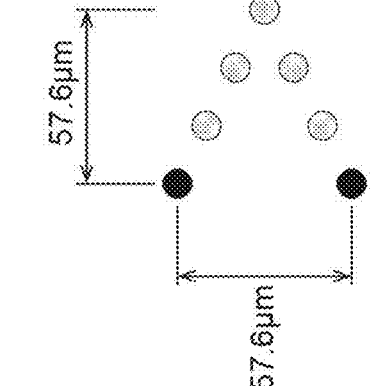

FIGS. 14 and 15 are diagrams for describing irradiation position design examples when the intensity of the laser light is controlled. In FIGS. 14 and 15, (a) is a design example of the laser irradiation arrangement, (b) is a pattern of the laser focusing positions, and (c) is a modulation pattern (a hologram pattern) displayed on the spatial light modulator 38. FIG. 14 shows an example in which both end portions of the street 23 in the width direction are the first regions 23x, and the relative intensity of the laser light is 0.3, the center portion of the street 23 in the width direction is the second region 23y, and the relative intensity of the laser light is 1.0. FIG. 15 shows an example in which both end portions of the street 23 in the width direction are the second regions 23y, and the relative intensity of the laser light is 1.0, the center portion of the street 23 in the width direction is the first region 23x, and the relative intensity of the laser light is 0.3.

In the example shown in FIG. 14, for example, the laser irradiation arrangement is as shown in FIG. 14(*a*). As shown in FIG. 14(*a*), for example, the distance between both end portions of the focal points in the first direction is 57.6 μm, and the distance between both end portions of the focal points in the second direction is 57.6 μm. Then, the hologram pattern shown in FIG. 14(*c*) is generated as the hologram pattern that realizes the pattern of the laser focal positions shown in FIG. 14(*b*). In the example shown in FIG. 15, for example, the laser irradiation arrangement is as shown in FIG. 15(*a*). For example, as shown in FIG. 15(*a*), the distance between both end portions of the focal points in the first direction is 57.6 μm, and the distance between both end portions of the focal points in the second direction is 57.6 μm. Then, the hologram pattern shown in FIG. 15(*c*) is generated as the hologram pattern that realizes the pattern of the laser condensing positions shown in FIG. 15(*b*).

Further, the control unit 5 controls the support unit 2 so that the laser light moves relatively along the streets 23 in the first direction (the extension direction of the street 23), and a plurality of focal points of the laser light may be disposed at different positions in the second direction (the width direction of the streets 23) and at positions that do not overlap each other in the first direction.

Figure 16:
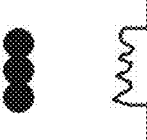
FIG. 16 is a diagram for describing an interference effect of light.

FIG. 16 is a diagram for describing a light interference effect. In FIG. 16, black circles indicate the designed focal points of the simultaneously radiated laser light, and a graph next to the black circles indicates an example of the actually observed light intensity distribution. When grouping processing is performed on the streets 23, uniform processing is required in the width direction (the second direction) of the streets 23. However, as shown in FIG. 16, when a plurality of laser lights are simultaneously formed linearly in the width direction (the second direction) of the street 23, due to the light interference effect in which the plurality of laser lights interfere with each other, an intensity distribution becomes different from a light intensity distribution in the case of single irradiation, and the intensity distribution becomes non-uniform.

Figure 17:
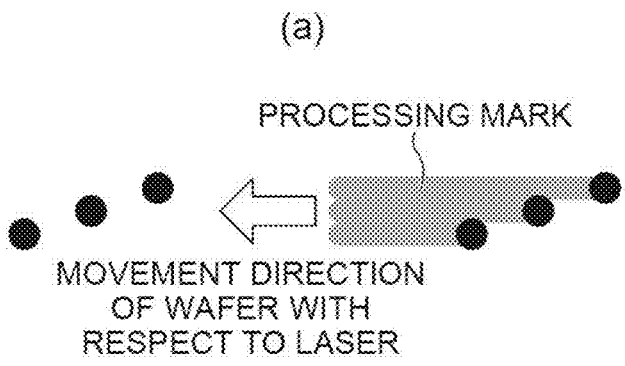
FIG. 17 is a diagram for describing the aspect of the laser irradiation.
Figure 17:
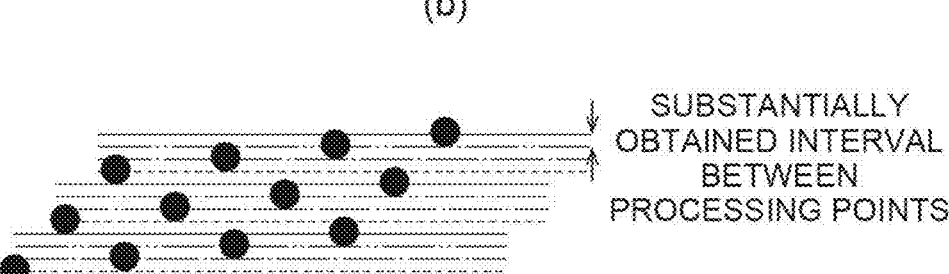

FIG. 17 is a diagram for describing a mode of the laser irradiation when focal points of the plurality of laser lights are shifted on the surface. In FIG. 17, the black circle indicates the focal point of the laser light, the left-right direction indicates the extension direction of the street 23 (the first direction), and the vertical direction indicates the width direction of the street 23 (the second direction). As a method for avoiding non-uniform light intensity distribution due to the above-described light interference effect, as shown in FIG. 17(*a*), it is conceivable to arrange the focal points of a plurality of laser lights at positions different from each other in the second direction and do not overlap each other in the first direction. There is no influence of the above-described light interference effect by arranging the focal points of the plurality of laser lights to be shifted on the surface in this manner. Further, as shown in FIG. 17(*a*), since processing marks are the same as when the focal points are disposed not to be shifted on the surface (the focal points are disposed side by side in the second direction) by the laser light relatively moving in the first direction along the street 23, it is possible to obtain a processing result equivalent to that of a uniform irradiation (top hat) profile. As shown in FIG. 17(*b*), when the focal points of a plurality of laser lights are disposed at positions that do not overlap each other in the first direction but overlap each other in the second direction (positions that partially overlap), the focal points (processing points) can be disposed at high density, and substantially obtained intervals between the processing points in the second direction can be arbitrarily narrowed without receiving the interference effects.

Further, the control unit 5 may dynamically change the arrangement of the laser focal points (the laser irradiation pattern) according to a wafer structure during the grouping process. During the grooving process, the control unit 5 identifies the wafer structure based on the image data of each of the streets 23 acquired from the imaging unit 4 and controls the irradiation unit 3 so as to arrange the laser focal points according to the identified wafer structure.

Figure 18:
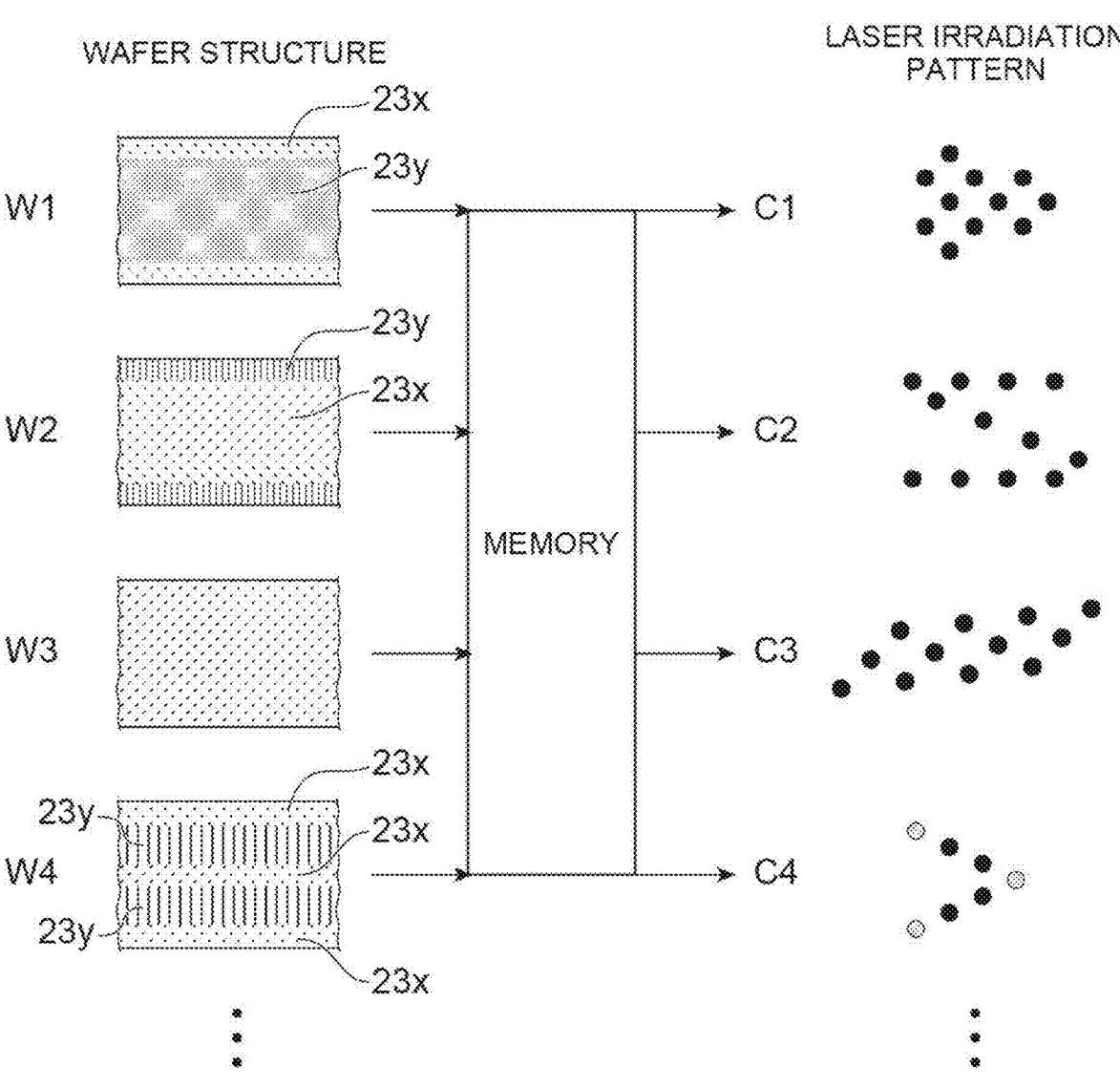
FIG. 18 is a diagram for describing the aspect of the laser irradiation.

In the example shown in FIG. 18, structures W1, W2, W3, and W4 are shown as structures of the streets 23 of the wafer 20. In the structure W1, both end portions of the street 23 in the width direction are the first regions 23x made of a material with a low processing threshold value, and the central portion of the street 23 in the width direction is the second region 23y made of a material with a high processing threshold value. In the structure W2, the end portions of the street 23 in the width direction are the second regions 23y, and the central portion of the street 23 in the width direction is the first region 23x. In the structure W3, the processing threshold value is the same for all regions (for example, the first region 23x). In the structure W4, the both end portions of the street 23 in the width direction and the central portion thereof in the width direction are the first regions 23x, and positions sandwiched between the first regions 23x are the second regions 23y.

In this case, during the grooving processing, when the image data of the street 23 acquired from the imaging unit 4 is identified by as the structure W1, the control unit 5 refers to the storage unit 52 (the memory) and performs the laser irradiation according to a laser irradiation pattern C1. In the laser irradiation pattern C1, there is only one irradiation position (focal point) in the extension direction of the street 23 at both end portions of the street 23 in the width direction, and three irradiation positions (focal points) in the extension direction of the street 23 per specific range are provided in the central portion of the street 23 in the width direction. During the grooving process, when the image data of the street 23 acquired from the imaging unit 4 is identified as the structure W2, the control unit 5 refers to the storage unit 52 (the memory) and performs laser irradiation according to a laser irradiation pattern C2. In the laser irradiation pattern C2, there are four irradiation positions (focal points) in the extension direction of the street 23 at both end portions of the street 23 in the width direction, and there is only one irradiation position (focal point) in the extension direction of the street 23 per specific range at the central portion of the street 23 in the width direction. During the grooving process, when the image data of the street 23 acquired from the imaging unit 4 is identified as the structure W3, the control unit 5 refers to the storage unit 52 (the memory) and performs the laser irradiation according to a laser irradiation pattern C3. In the laser irradiation pattern C3, a plurality of focal points of the laser light are disposed at different positions in the second direction (the width direction of the streets 23) and at positions that do not overlap each other in the first direction. During the grooving process, when the image data of the street 23 acquired from the imaging unit 4 is identified as the structure W4, the control unit 5 refers to the storage unit 52 (the memory) and performs the laser irradiation according to a laser irradiation pattern C4. In the laser irradiation pattern C4, the intensity of the laser light with which the second region 23y is irradiated is made higher than the intensity of the laser light with which the first region 23x is irradiated.

Figure 19:
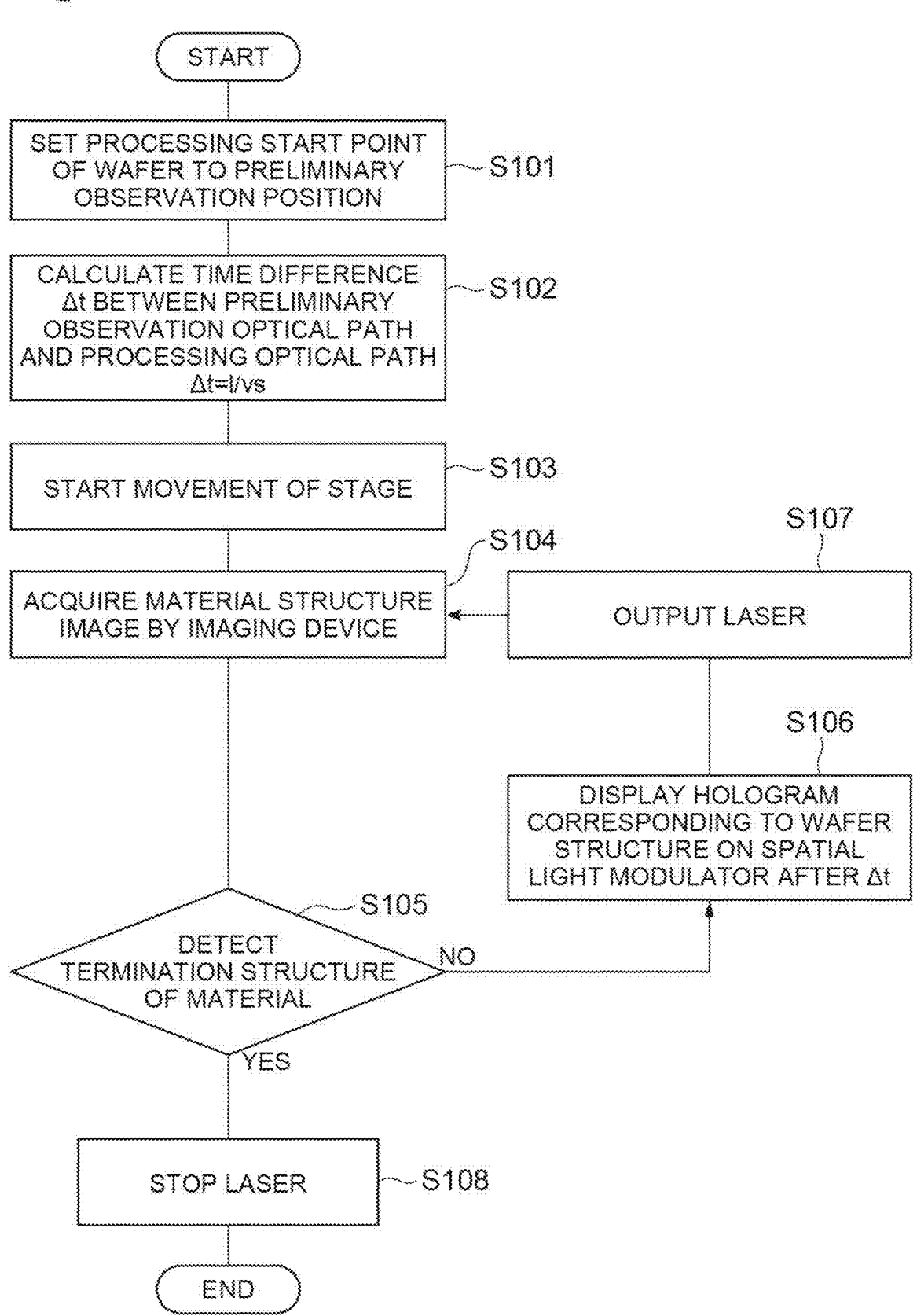
FIG. 19 is a flowchart of a laser processing method of one embodiment.

FIG. 19 is a flow chart of a laser processing method when the arrangement of the laser focal points (the laser irradiation pattern) is dynamically changed according to the wafer structure during grooving processing. As shown in FIG. 19, in the laser processing method, first, a processing start position of the street 23 of the wafer 20 is set to a preliminary observation position (Step S101). The preliminary observation position is a position irradiated with visible light for imaging by the imaging unit 4.

Subsequently, a time difference $\Delta t=1/vs$ between a preliminary observation optical path and a processing optical path is calculated (Step S102). 1 is a distance between the preliminary observation optical path and the processing optical path. vs is a moving speed of the wafer 20. The preliminary observation optical path is an optical path of the visible light for imaging by the imaging unit 4, and the processing optical path is an optical path for laser irradiation by the irradiation unit 3. It is possible to identify at what timing after imaging the laser irradiation pattern should be changed according to the imaging result by deriving the time difference $\Delta t$.

Subsequently, the movement of the support unit 2 (a stage) on which the wafer 20 is placed is started (Step S103). Subsequently, a structure image (a material structure image) of the street 23 of the wafer is imagined by the imaging device 44 of the imaging unit 4 (Step S104), and it is determined whether or not a termination structure of the street 23 of the wafer 20 is detected (Step S105). When the termination structure is detected, the laser irradiation is stopped (Step S108), and the processing ends.

On the other hand, when the termination structure is not detected, the laser irradiation pattern corresponding to the structure of the street 23 is identified, and after the above-described $\Delta t$, an irradiation pattern (a hologram) corresponding to the identified structure is displayed on the spatial light modulator 38 (Step S106). Then, the laser irradiation is started (Step S107), and the processing of Step S104 is performed again.

The control unit 5 may control the power density (the laser irradiation intensity) by, for example, shifting the focus position of the focal point in a part of the region and may adjust the power for removing the surface layer in each of the regions of the street 23.

An example of each parameter in the laser processing described in the embodiment is as follows. Wavelength: 515 nm, Pulse width: 600 fs, Repetition frequency: 20 kHz, Pulse energy: 2.5 µJ, Computer generated hologram resolution: 1.6 µm/pixel, Objective lens: NA 0.26, 10 times.

Actions and Effects

The laser processing apparatus 1 according to the embodiment includes a support unit 2 that supports a wafer 20 including a plurality of functional elements 22 disposed adjacent to each other via a street 23, an irradiation unit 3 that irradiates the street 23 with laser light, and a control unit 5 that controls the irradiation unit 3 based on information about the streets 23 so that a first region and a second region of the street 23 are simultaneously irradiated with the laser light, and a power of the laser light for removing a surface layer of the street 23 in the second region is higher than a power for removing the surface layer of the street 23 in the first region, wherein the information about the street 23 includes information that a processing threshold value indicating a difficulty of laser processing in the first region is lower than a processing threshold value in the second region.

In the laser processing apparatus 1 according to the embodiment, in grouping processing for removing the surface layer of the street 23, the irradiation unit 3 is controlled so that the radiation of laser light to the first region and the second region is performed simultaneously, and the power for removing the surface layer in the second region with a high processing threshold value is greater than the power for removing the surface layer in the first region with a low processing threshold value. As described above, in a case in which there are regions with different processing threshold values in the street 23, for example, when the laser light is radiated in accordance with the region with the high processing threshold value, the region with the low processing threshold value may be thermally damaged. On the other hand, for example, when the laser light is radiated in accordance with the region with the low processing threshold value, the surface layer of the region with the high processing threshold value is not sufficiently removed, thus it is necessary to radiate the laser light multiple times, and the throughput of processing deteriorates. In this regard, in the laser processing apparatus 1 according to the present embodiment, for the second region having a relatively high processing threshold value, the power for removing the surface layer of the street 23 is made larger than that for the first region based on information about the processing threshold value of each of the regions, and the irradiation of the first region and the second region with the laser light is performed at the same time. In this way, laser irradiation with an intensity that does not cause thermal damage to the region with a low processing threshold value and laser irradiation with an intensity that does not require repeated processing for the region with a high processing threshold value are realized at the same time by irradiating each of the regions with laser light at the same time under conditions for each of the regions so that the power for removing the surface layer increases in the region with the higher processing threshold value according to the processing threshold value of each of the regions instead of radiating the laser light under conditions common to all regions according to one of the processing threshold values. As described above, according to the laser processing apparatus 1 according to the present embodiment, the wafer 20 can be efficiently processed while thermal damage to the wafer 20 is suppressed.

The control unit 5 may increase the power of the laser light for removing the surface layer in the second region more than the power for removing the surface layer in the first region by arranging the laser light focal points so that the number of laser light focal points per specific range in the second region is greater than the number of laser light focal points per specific range in the first region. According to such a configuration, it is possible to easily adjust the power for removing the surface layer of the laser light in each of the regions only by arranging the irradiation positions (the focal points) without adjusting the intensity of the laser light itself.

The control unit 5 may increase the power of the laser light for removing the surface layer in the second region more than the power for removing the surface layer in the first region by increasing the intensity of the laser light radiated to the second region more than the intensity of the laser light radiated to the first region. According to such a configuration, it is possible to easily adjust the power with which the laser light removes the surface layer in each of the regions only by adjusting the intensity of the laser light without complicating the arrangement of the focal points.

The control unit 5 controls at least one of the support unit 2 and the irradiation unit 3 so that the laser light moves relatively along the street 23 in the first direction, and the control unit 5 may arrange a plurality of focal points of the laser light at positions different from each other in the second direction, which is the width direction of the street 23 intersecting the first direction, but not overlapping each other in the first direction. Although it is desirable to arrange the plurality of focal points densely to some extent, when the plurality of focal points of the laser light are disposed linearly in the width direction (the second direction) of the street 23, the intensity distribution of the laser light in the second direction becomes non-uniform due to the light interference effect. In this regard, the influence of the light interference effect described above is reduced by arranging the plurality of focal points at positions that do not overlap each other in the first direction (that is, not disposed linearly in the second direction), and it is possible to obtain a processing result equivalent to that of laser light having a uniform irradiation profile in the second direction.

The laser processing apparatus 1 may further include an imaging unit 4 that acquires image data of the street 23, and the control unit 5 may identify the first region and the second region based on the image data. Each of the regions of the street 23 can be appropriately identified by identifying the first region and the second region in the street 23 of the wafer 20 based on the imagined image data in this way, and laser light irradiation can be appropriately performed according to the region.

The laser processing method according to the embodiment includes a first step of preparing a wafer 20 including a plurality of functional elements 22 disposed adjacent to each other via a street 23, and a second step of simultaneously irradiating a first region and a second region of the street 23 with laser light based on information about the street 23, so that a power for removing a surface layer of the street 23 in the second region is greater than a power for removing the surface layer thereof in the first region, after the first step, wherein the information about the street 23 includes information that a processing threshold value indicating a difficulty of laser processing in the first region is lower than a processing threshold value in the second region. According to such a laser processing method, it is possible to efficiently process the wafer 20 while thermal damage to the wafer 20 is suppressed.

The laser processing method described above may further include a third step of acquiring image data of the street 23 after the first step and before the second step, and identifying the first region and the second region based on the image data. According to such a laser processing method, each of the regions of the street 23 can be appropriately identified, and laser light irradiation corresponding to the region can be appropriately performed.

The laser processing method described above may further include a fourth step of forming a modified region inside the wafer 20 along a line 15 passing through the street 23 after the first step. According to such a laser processing method, the wafer 20 can be divided into chips for each of the functional elements by allowing cracks extending from the modified region to reach the street 23 along the line 15.

REFERENCE SIGNS LIST

1 Laser processing apparatus
2 Support unit
3 Irradiation unit
4 Imaging unit
5 Control unit
11 Modified region
20 Wafer
22 Functional element
23 Street
23x First region
23y Second region

The invention claimed is:

1. A laser processing apparatus comprising:
a support unit configured to support a wafer including a plurality of functional elements disposed adjacent to each other via a street;
an irradiation unit configured to irradiate the street with laser light; and
a control unit configured to control the irradiation unit based on information about the street so that a first region and a second region of the street are irradiated with the laser light at the same time, and power of the laser light for removing a surface layer of the street in the second region is greater than power of the laser light to remove a surface layer of the street in the first region,
wherein the information about the street includes information that a processing threshold value indicating a difficulty of laser processing in the first region is lower than a processing threshold value in the second region, and wherein the control unit makes the power of the laser light for removing the surface layer in the second region greater than the power for removing the surface layer in the first region by arranging focal points of the laser light so that the number of focal points of the laser light per specific range in the second region is greater than the number of focal points of the laser light per specific range in the first region.

2. The laser processing apparatus according to claim 1, wherein the control unit increases the power of the laser light for removing the surface layer in the second region more than the power for removing the surface layer in the first region by making an intensity of the laser light radiated to the second region greater than an intensity of the laser light radiated to the first region.

3. The laser processing apparatus according to claim 1, wherein:

the control unit controls at least one of the support unit and the irradiation unit so that the laser light moves relatively along the street in a first direction; and the control unit arranges a plurality of focal points of the laser light at positions different from each other in a second direction, which is a width direction of the street intersecting the first direction, and not overlapping each other in the first direction.

4. The laser processing apparatus according to claim 1, further comprising an imaging unit configured to acquire image data of the street, wherein the control unit identifies the first region and the second region based on the image data.

5. A laser processing method comprising:

a first step of preparing a wafer including a plurality of functional elements disposed adjacent to each other via a street; and a second step of, after the first step, irradiating the first region and the second region of the street with laser light at the same time based on information about the street so that a power for removing a surface layer of the street in the second region is greater than a power for removing the surface layer of the street in the first region, wherein the information about the street includes information that a processing threshold value indicating a difficulty of laser processing in the first region is lower than a processing threshold value in the second region, and wherein the power of the laser light for removing the surface layer in the second region is made greater than the power for removing the surface layer in the first region by arranging focal points of the laser light so that the number of focal points of the laser light per specific range in the second region is greater than the number of focal points of the laser light per specific range in the first region.

6. The laser processing method according to claim 5, further comprising a third step of acquiring image data of the street and identifying the first region and the second region based on the image data, after the first step and before the second step.

7. The laser processing method according to claim 5, further comprising, after the first step, a fourth step of forming a modified region inside the wafer along a line passing through the street.

* * * * *